(12) United States Patent
Komoro

(10) Patent No.: US 12,514,440 B2
(45) Date of Patent: Jan. 6, 2026

(54) ENDOSCOPE

(71) Applicant: HOYA CORPORATION, Tokyo (JP)

(72) Inventor: Atsushi Komoro, Ibaraki (JP)

(73) Assignee: HOYA CORPORATION, Tokyo (JP)

( * ) Notice: Subject to any disclaimer, the term of this patent is extended or adjusted under 35 U.S.C. 154(b) by 332 days.

(21) Appl. No.: 18/033,868

(22) PCT Filed: Jan. 7, 2022

(86) PCT No.: PCT/JP2022/000340
§ 371 (c)(1),
(2) Date: Apr. 26, 2023

(87) PCT Pub. No.: WO2022/168528
PCT Pub. Date: Aug. 11, 2022

(65) Prior Publication Data
US 2024/0008729 A1 Jan. 11, 2024

(30) Foreign Application Priority Data
Feb. 5, 2021 (JP) .................................. 2021-017376

(51) Int. Cl.
A61B 1/06 (2006.01)
A61B 1/05 (2006.01)

(52) U.S. Cl.
CPC ............. A61B 1/0676 (2013.01); A61B 1/05 (2013.01); A61B 1/0607 (2013.01); A61B 1/0684 (2013.01)

(58) Field of Classification Search
CPC ... A61B 1/0607; A61B 1/0615; A61B 1/0676; A61B 1/0684; G02B 23/2461; G02B 23/2484; H04N 23/555; H04N 23/56
See application file for complete search history.

(56) References Cited

U.S. PATENT DOCUMENTS

2006/0058584 A1* 3/2006 Hirata .................. A61B 1/0684
600/179
2007/0106119 A1* 5/2007 Hirata ................ G02B 23/2423
600/179

(Continued)

FOREIGN PATENT DOCUMENTS

JP 11-267099 A 10/1999
JP 2004-248835 A 9/2004

(Continued)

OTHER PUBLICATIONS

International Search Report issued in WIPO Patent Application No. PCT/JP2022/000340, dated Apr. 5, 2022, along with an English translation thereof.

(Continued)

Primary Examiner — Alexandra L Newton
(74) Attorney, Agent, or Firm — Greenblum & Bernstein, P.L.C.

(57) ABSTRACT

An endoscope includes a light emitting module incorporated in a distal end portion of an insertion tube, the light emitting module includes a mounting substrate on which a plurality of light emitting elements is mounted, the mounting substrate has an annular shape in which a hole through which an image sensor using the light emitting elements as a light source is to be inserted is provided in a central portion and includes a first surface on which the light emitting elements are surface-mounted and a side surface located at a peripheral edge of the first surface, a conductive portion electrically connected to the light emitting elements is provided on the side surface, and a power supply line for supplying power to the light emitting element is connected to the conductive portion.

5 Claims, 6 Drawing Sheets

(56) References Cited

U.S. PATENT DOCUMENTS

| | | | |
|---|---|---|---|
| 2007/0191684 A1* | 8/2007 | Hirata | A61B 1/0607 600/152 |
| 2008/0300457 A1 | 12/2008 | Hosaka et al. | |
| 2016/0103312 A1 | 4/2016 | Furuta | |
| 2018/0084635 A1* | 3/2018 | Palaniswamy | H05K 1/0207 |
| 2020/0113424 A1 | 4/2020 | Griffin | |
| 2020/0364575 A1 | 11/2020 | Griffin | |
| 2021/0196106 A1* | 7/2021 | Dayton | A61B 90/30 |

FOREIGN PATENT DOCUMENTS

| | | | |
|---|---|---|---|
| JP | 2005-270391 A | 10/2005 | |
| JP | 4488286 B2 | 6/2010 | |
| JP | 2015-16021 A | 1/2015 | |

OTHER PUBLICATIONS

European search report issued in related European application No. 22749407.7, dated Sep. 2, 2024.

First Office Action issued in Chinese Patent Application No. 202280007269.5, dated May 20, 2025, along with an English translation thereof.

\* cited by examiner

ENDOSCOPE

TECHNICAL FIELD

The present disclosure relates to an endoscope.

The present application claims priority based on Japanese Patent Application No. 2021-017376 filed on Feb. 5, 2021, the entire content of which is incorporated herein by reference.

BACKGROUND ART

An endoscope is a medical instrument to be inserted into a body cavity of a subject to observe and treat a desired site and includes an imaging unit provided in a distal end portion of an insertion tube to be inserted into the body cavity, and an illumination device illuminating an imaging field of view of the imaging unit. Patent Literature 1 discloses an endoscope including an illumination device for achieving illumination in a wide angular range of equal to or greater than 180 degrees to enable observation at a wide viewing angle.

CITATION LIST

Patent Literature

Patent Literature 1: JP 2015-16021 A

SUMMARY OF INVENTION

Technical Problem

However, in the endoscope device described in Patent Literature 1, there is a problem that, in providing a conductive portion to which a power supply line for supplying power to the illumination device is connected, suitable arrangement of the conductive portion is not considered.

In one aspect, an object is to provide an endoscope in which a conductive portion to which a power supply line for supplying power to a light emitting element is connected can be suitably arranged.

Solution to Problem

An endoscope according to one aspect of the present disclosure is an endoscope including a light emitting module incorporated in a distal end portion of an insertion tube, in which the light emitting module includes a mounting substrate on which a plurality of light emitting elements is mounted, the mounting substrate has an annular shape in which a hole through which an image sensor using the light emitting elements as a light source is to be inserted is provided in a central portion and includes a first surface on which the light emitting elements are surface-mounted and a side surface located at a peripheral edge of the first surface, a conductive portion electrically connected to the light emitting elements is provided on the side surface, and a power supply line for supplying power to the light emitting elements is connected to the conductive portion.

Advantageous Effects of Invention

According to the present disclosure, it is possible to provide an endoscope in which a conductive portion to which a power supply line for supplying power to a light emitting element is connected is suitably arranged.

DESCRIPTION OF EMBODIMENTS

First Embodiment

Figure 1:
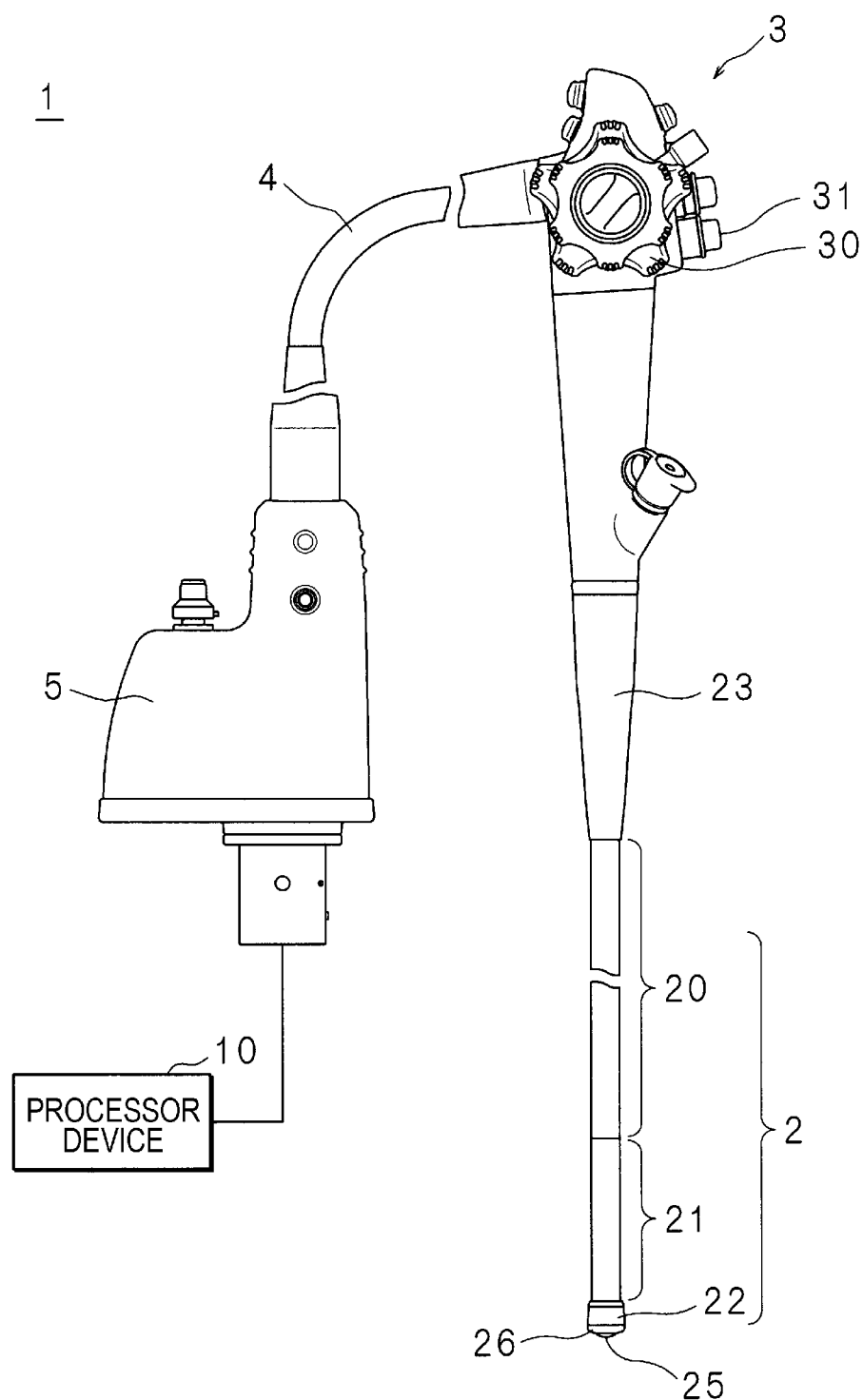
FIG. 1 is an external view of an endoscope according to a first embodiment.

Hereinafter, the present invention will be described in detail with reference to the drawings illustrating embodiments of the present invention. FIG. 1 is an external view of an endoscope 1 according to a first embodiment. The endoscope 1 includes an insertion tube 2, an operation unit 3, a universal tube 4, and a connector unit 5. The insertion tube 2 is a portion to be inserted into a body cavity and includes a long soft portion 20 and a distal end portion 22 connected to one end of the soft portion 20 via a bending section 21. The other end of the soft portion 20 is connected to the operation unit 3 via a cylindrical connection portion 23. The universal tube 4 has one end connected to the operation unit 3 and extends in a direction different from the insertion tube 2, and the connector unit 5 is connected to the other end of the universal tube 4.

The operation unit 3 is provided to be gripped by a user (operator) of the endoscope 1 such as a doctor to perform various kinds of operation and includes a bending operation knob 30 and a plurality of operation buttons 31, and the like. The bending operation knob 30 is connected to the bending section 21 by a wire (not illustrated) passing through inside of each of the connection portion 23 and the soft portion 20. The bending section 21 is bent in two directions orthogonal to each other in an axial cross section through operation of the bending operation knob 30, thereby changing a direction of the distal end portion 22 inserted into a body cavity.

The endoscope 1 is connected to a processor device 10 via the connector unit 5 and is used as an endoscope 1 device. The processor device 10 includes a control unit, a storage unit, a signal processing circuit, and the like, and integrally controls the endoscope device by a control program stored in the storage unit.

Figure 2:
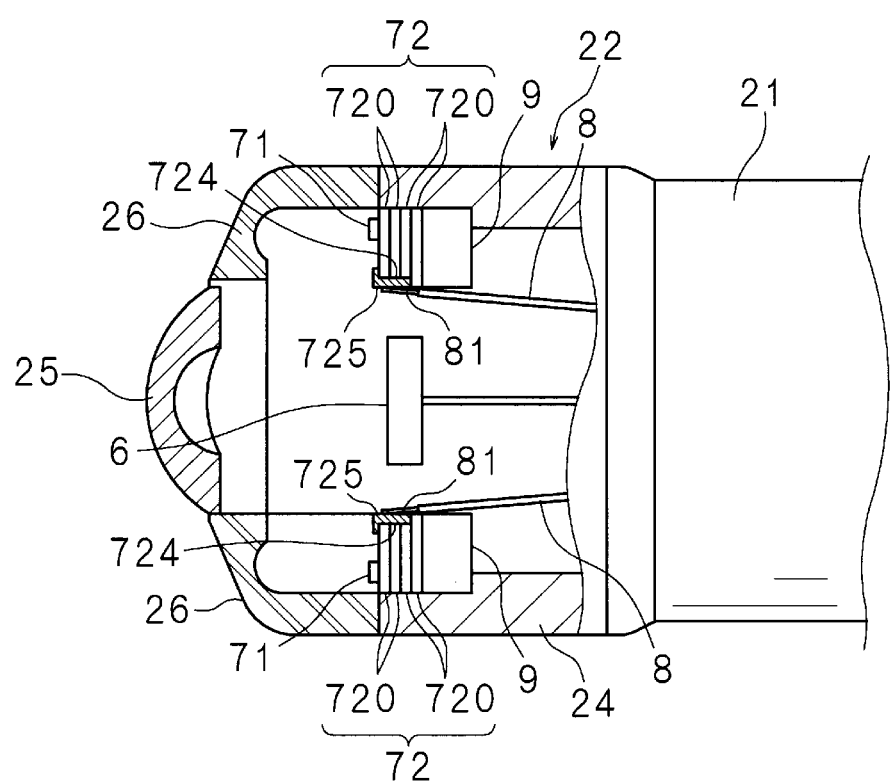
FIG. 2 is an enlarged view of a distal end portion of an insertion tube.

FIG. 2 is an enlarged view of the distal end portion of the insertion tube. The distal end portion 22 includes a cylindrical housing 24 having one side fixed to the bending section 21. The other side of the housing 24 is covered with a central objective lens 25 and an annular light distribution lens 26 surrounding a periphery of the objective lens 25. An image sensor 6 is provided inside the housing 24 to face an inner side of the objective lens 25. The image sensor 6 captures an image of a subject to be observed (an object), which is a body part such as a body cavity, through the objective lens 25. The objective lens 25 is fitted into an inner frame of a hole provided in the distal end portion 22 of the insertion tube 2 and functions as an observation window. A light emitting module 7 is incorporated so as face inside of the light distribution lens 26.

The image sensor 6 includes a semiconductor element such as a complementary metal oxide semiconductor (CMOS) and an optical system for forming an image on an imaging surface of the image sensor and captures an image of inside of the body cavity through the objective lens 25. The objective lens 25 is, for example, a wide-angle lens, and the image sensor 6 is constituted to capture an image at a viewing angle of equal to or greater than 180 degrees by setting the optical system including the objective lens 25. The image sensor 6 outputs captured image data (image signal) of the subject to be observed (object) via a signal line joined to the image sensor 6. The captured image data (image signal) output from the image sensor 6 is subjected to preprocessing such as AD conversion or white balance correction, for example, and is output to the processor device 10.

The light emitting module 7 includes an annular mounting substrate 72 surrounding a periphery of the image sensor 6 and a plurality of light emitting elements 71 mounted on a first surface (mounting surface) of the mounting substrate 72 facing the light distribution lens 26. The plurality of light emitting elements includes, for example, a white LED, a narrowband LED, or a combination of both LEDs. The plurality of light emitting elements is arranged at equal intervals along a circumference of the annular mounting substrate 72, for example, one by one or two by two. A circular hole is formed in a central portion of the annular mounting substrate 72, and the image sensor 6 is located at the center of the circular hole. As a result, an outer peripheral surface of the image sensor 6 faces an inner peripheral surface (inner peripheral side surface) of the hole formed in the mounting substrate 72.

The light distribution lens 26 is a cylindrical lens having a shape extending outward from a peripheral edge portion of the objective lens 25 and continuing to a peripheral wall of the housing 24 through a bending portion. Light emitted from the light emitting element 71 is emitted through the light distribution lens 26 to illuminate an imaging field of view of the image sensor 6. The image sensor 6 captures an image under illumination by light emission of the light emitting element 71.

Figure 3:
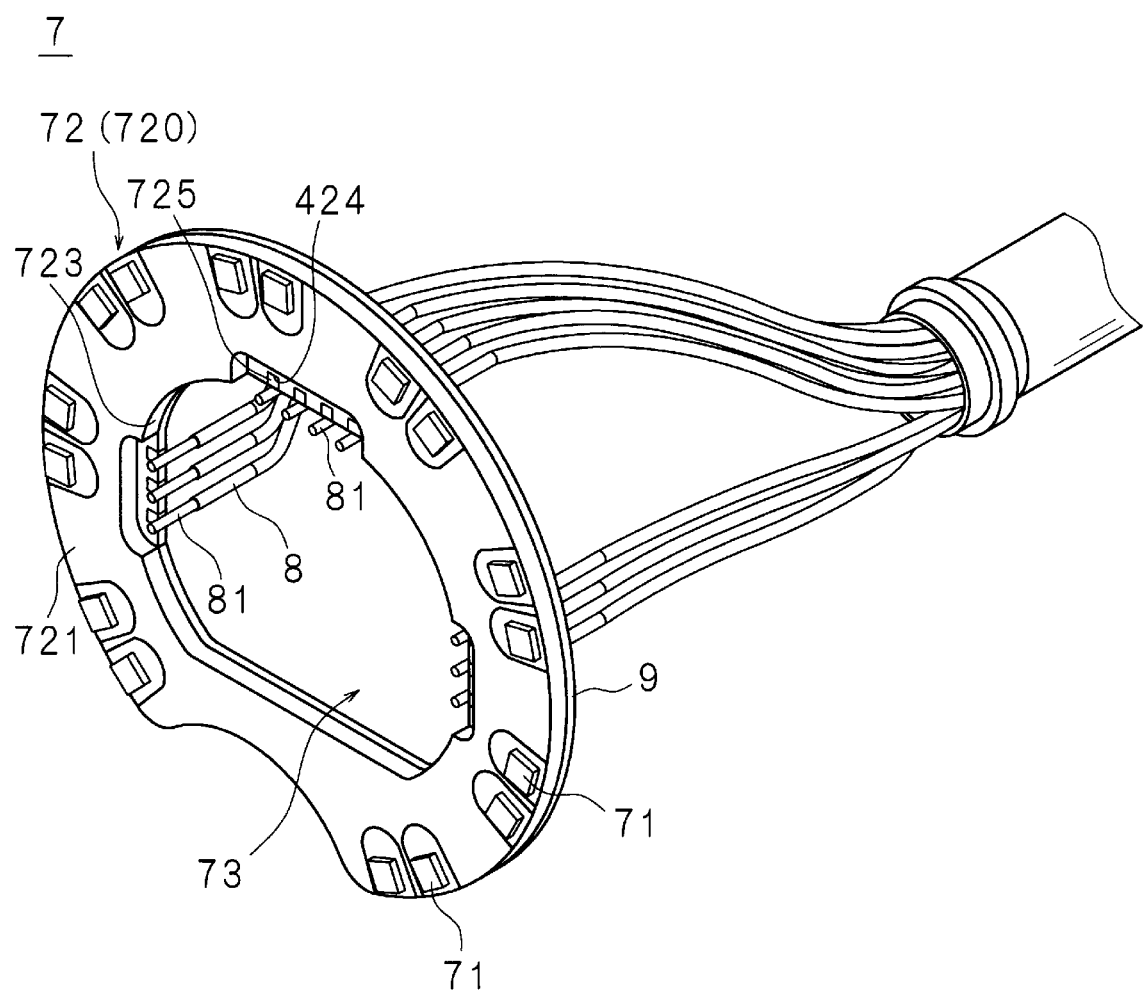
FIG. 3 is an explanatory diagram for explaining an example of a connection state between a mounting substrate and a power supply line.
Figure 4:
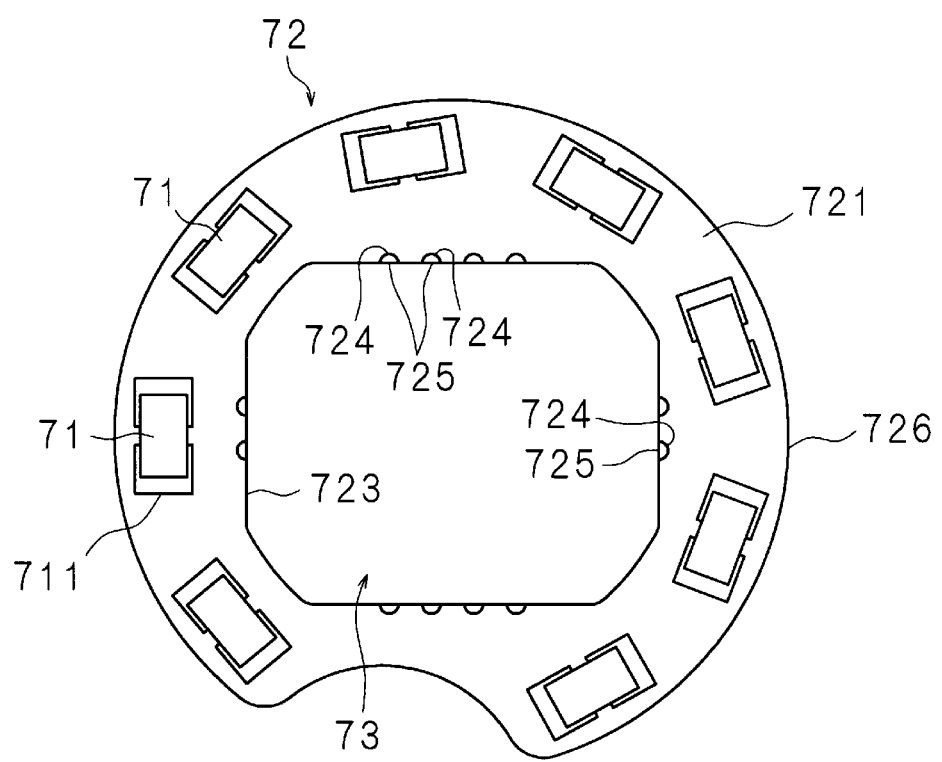
FIG. 4 is a schematic plan view for explaining an example of the mounting substrate.
Figure 5:
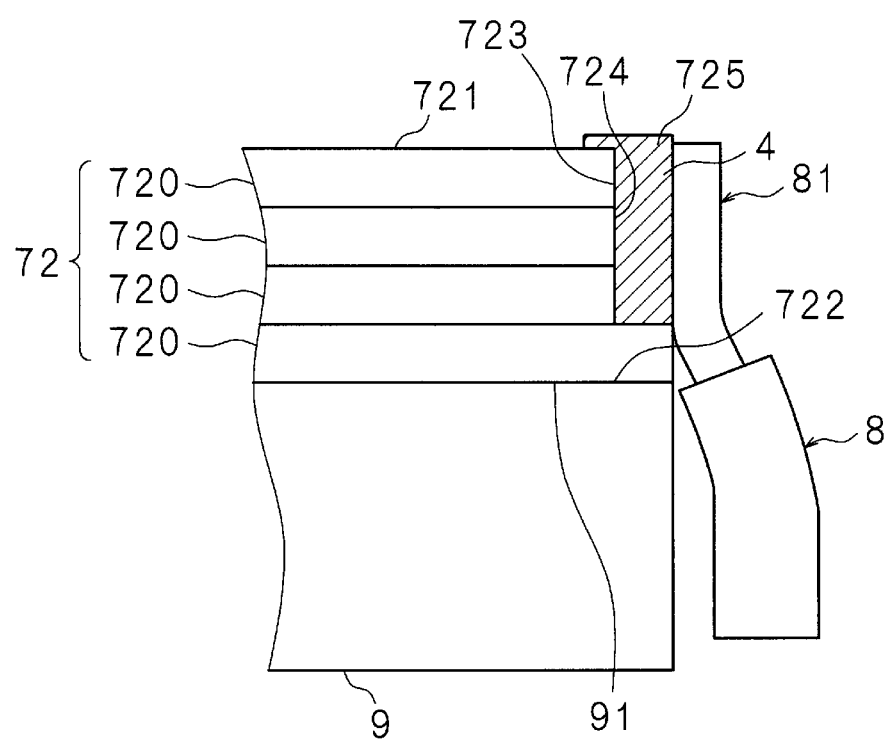
FIG. 5 is a schematic sectional side view illustrating an example of the mounting substrate.

FIG. 3 is an explanatory diagram for explaining an example of a connection state between the mounting substrate 72 and the power supply line 8. FIG. 4 is a schematic plan view illustrating an example of the mounting substrate 72. FIG. 5 is a schematic sectional side view illustrating an example of the mounting substrate 72. The mounting substrate 72 is a multilayer substrate formed by building up a plurality of substrates 720 (four substrates 720 in the present embodiment). The mounting substrate 72 includes a first surface 721 which is a mounting surface on which the light emitting element 71 is mounted and a second surface 722 located on an opposite side of the first surface 721, and a heat radiator 9 is provided in close contact with the second surface 722. Accordingly, the heat radiator 9 and the mounting substrate 72 are thermally connected to each other.

In each substrate 720 constituting the mounting substrate 72 which is a multilayer substrate, the first surface 721 which is a mounting surface on which the light emitting element 71 is mounted corresponds to a surface of the substrate 720 positioned on the most distal end side (the side of the objective lens 25), and the second surface 722 with which the heat radiator 9 is in close contact corresponds to a rear surface of the substrate 720 positioned on the most rear end side (the side of the bending section 21).

A side surface located at a peripheral edge of the first surface 721 includes an inner peripheral side surface 723 that is an inner peripheral surface of the hole 73 formed in the annular mounting substrate 72 and an outer peripheral side surface 726 of the mounting substrate 72. On the inner peripheral side surface 723, a plurality of cutout portions 724 cut out in a thickness direction of the mounting substrate 72 are formed. In other words, the cutout portions 724 are formed on the side surface of the substrates 720 constituting the mounting substrate 72 as the multilayer substrate, and the cutout portions 724 of the substrates 720 are provided so as to be continuous in the thickness direction of the substrates 720, whereby groove-shaped cutout portions 724 along the thickness direction of the multilayer substrate are formed on the inner peripheral side surface 723 of the multilayer substrate.

The cutout portions 724 may be formed in all the substrates 720 constituting the mounting substrate 72 (multilayer substrate) or may be formed only in part of the substrates 720 including at least the substrate 720 having the first surface 721 which is the mounting surface on which the light emitting element is 71 mounted. In the present embodiment, the cutout portion 724 is formed in the substrate 720 other than the substrate 720 with which the heat radiator 9 is in close contact among the plurality of substrates 720 constituting the multilayer substrate. In other words, the substrate 720 with which the heat radiator 9 is in close contact, that is, the substrate 720 of the second surface 722 is not provided with the cutout portion 724. By not providing the cutout portion 724 and the conductive portion 725 in the substrate 720 in close contact with the heat radiator 9 among the plurality of substrates 720 constituting the multilayer substrate as described above, the heat radiator 9 can be insulated from the conductive portion 725 provided in the cutout portion 724 of the other substrate 720 by the substrate 720 in close contact with the heat radiator 9.

The conductive portion 725 is provided in the cutout portion 724 formed in the inner peripheral side surface 723, that is, a groove formed in the inner peripheral side surface 723 in the thickness direction. The conductive portion 725 is made of a conductive material having good conductivity such as copper, a copper alloy or a conductor paste, and is, for example, a cable connection land. The conductive portion 725 is provided so as to fill the cutout portion 724 (groove) formed in the inner peripheral side surface 723.

An end portion of the conductive portion 725 on the first surface 721 side may be provided so as to be positioned on the first surface 721 and may have an L shape. As illustrated in the present embodiment, in the L-shaped conductive portion 725, a portion of the conductive portion 725 provided in the cutout portion 724 may correspond to a vertical side portion of the L shape, and a portion of the conductive portion 725 located on the first surface 721 may correspond to a horizontal side portion of the L shape. A core wire 81 of the power supply line 8 is joined to the portion of the conductive portion 725 corresponding to the vertical side portion of the L shape.

The conductive portion 725 is electrically connected to a terminal of the light emitting element 71 or the light emitting element land 711 via a wiring pattern, a land, a through hole, or the like, provided on the first surface 721 and the surface of each layered substrate 720. As described above, the light emitting element 71 is constituted with an LED, or the like, and the conductive portion 725 includes the conductive portion 725 (positive electrode side conductive portion)

connected to an anode (positive electrode side) of the LED and the conductive portion 725 (negative electrode side conductive portion) connected to a cathode (negative electrode side).

The number of the conductive portions 725 is determined on the basis of an individual control mode for each of the plurality of light emitting elements 71. For example, in a case where brightness of each of the light emitting elements 71 (LED) is controlled when eight light emitting elements 71 (LED) are mounted, eight conductive portions 725 (positive electrode side conductive portions) may be provided on the anode side, and on the cathode side, one conductive portion 725 (negative electrode side conductive portion) obtained by combining the conductive portions into one circuit may be provided, or two conductive portions 725 (negative electrode side conductive portions) provided with redundancy against disconnection may be provided as two circuits. As described above, the number of cathode-side conductive portions 725 (negative electrode side conductive portions) may be smaller than the number of anode-side conductive portions 725 (positive electrode side conductive portions).

The cutout portion 724 and the conductive portion 725 provided in the inner peripheral side surface 723 of the mounting substrate 72 may be formed by cutting a via hole (VIA) into half when forming (boring) the hole 73 so as to annularly form the mounting substrate 72 or may be pattern-formed after molding the mounting substrate 72.

The core wire 81 of the power supply line 8 extending from the processor device 10 is joined to the conductive portion 725. Power from the processor device 10 is supplied to the light emitting module 7 via the power supply line 8 and the conductive portion 725 and turns on the light emitting element 71.

The power supply line 8 extending from the processor device 10 side is connected so as to be parallel (parallel) to the conductive portion 725, that is, parallel to the groove-shaped cutout portion 724 along the thickness direction of the multilayer substrate with reference to an extending direction of the insertion tube 2. As a result, an axial direction of the core wire 81 of the power supply line 8 joined to the conductive portion 725 is parallel to the extending direction of the insertion tube 2 and becomes the thickness direction of the mounting substrate 72, and the core wire 81 is also located inside the hole 73 of the mounting substrate 72. The power supply line 8 extending from the processor device 10 side in this manner is connected in parallel to the conductive portion 725 in the extending direction of the insertion tube 2, so that it is possible to prevent bending of the power supply line 8 at a portion of the power supply line 8 in the vicinity of a portion to which the conductive portion 725 is connected. This makes it possible to prevent generation of stress acting in a direction in which the power supply line 8 is peeled off from the conductive portion 725 and to secure or improve connection strength between the power supply line 8 and the conductive portion 725.

The heat radiator 9 is made of a metal having high thermal conductivity and is formed of an annular plate member similar to the mounting substrate 72. Similarly to the mounting substrate 72, the annular heat radiator 9 is provided with a hole at the center, and the hole of the heat radiator 9 and the hole 73 of the mounting substrate 72 form concentric circles. The plurality of power supply lines 8 and signal lines to be connected to the image sensor 6 are located inside the hole of the heat radiator 9.

The heat radiator 9 is in close contact with the second surface 722 of the mounting substrate 72, and the mounting substrate 72 and the heat radiator 9 are thermally connected to each other. As a result, heat generated by the light emitting element 71 is dissipated to a surrounding space via the heat radiator 9, which prevents temperature rise of the light emitting element 71 and cools the light emitting element 71. It goes without saying that the second surface 722 of the mounting substrate 72 is electrically insulated from the heat radiator 9. The present invention is not limited to a case where the mounting substrate 72 (second surface 722) and the heat radiator 9 (adhesive surface 91) are in direct close contact with each other, and a heat conductive paste having insulating properties may be provided between the mounting substrate 72 (second surface 722) and the heat radiator 9 (close contact surface 91).

The outer peripheral surface of the image sensor 6 faces the inner peripheral side surface 723 of the mounting substrate 72 on which the conductive portion 725 is provided, and a resin member, or the like, having insulating properties may be provided in a gap formed between the outer peripheral surface of the image sensor 6 and the inner peripheral side surface 723 of the mounting substrate 72. By providing the insulating resin member, or the like, sealed in the gap, it is possible to secure insulation between the image sensor 6 and the conductive portion 725 and the core wire 81 connected to the conductive portion 725.

In the present embodiment, the cutout portion 724 and the conductive portion 725 are provided on the inner peripheral side surface 723 of the mounting substrate 72, but are not limited thereto, and may be provided on the outer peripheral side surface 726 of the mounting substrate 72. In the present embodiment, the mounting substrate 72 is a multilayer substrate, but the present invention is not limited thereto, and the mounting substrate 72 may be a single-layer substrate including one substrate 720.

According to the present embodiment, the conductive portion 725 to which the power supply line 8 for supplying power to the light emitting element 71 is connected is provided on the inner peripheral side surface 723 located on the peripheral edge of the first surface 721 on which the light emitting element 71 is surface-mounted. As a result, it is not necessary to provide the conductive portion 725 (a portion of the conductive portion 725 to be joined to the core wire 81) on the first surface 721, and the conductive portion 725 can be suitably arranged in the mounting substrate 72 that is to be included in the distal end portion of the insertion tube 2. An area of the first surface 721 can be reduced, and a size of the distal end portion of the insertion tube 2 into which the light emitting module 7 is to be incorporated can be reduced. By reducing the area of the first surface 721, a diameter of the hole 73 provided in the mounting substrate 72 can be increased, whereby a size of the image sensor 6 to be inserted and arranged in the hole 73 can be increased without increasing an outer diameter of the mounting substrate 72 and a size of the distal end portion of the insertion tube 2. It is possible to expand a mounting space of the first surface 721, improve a degree of freedom (degree of freedom in mounting) in arrangement of the light emitting elements 71 on the first surface 721 and increase the number of the light emitting elements 71 mounted, so that a large number of the plurality of light emitting elements 71 can be arranged. The conductive portion 725 is provided on the inner peripheral side surface 723 constituting the inner peripheral surface of the hole 73 through which the image sensor 6 is to be inserted, and thus, the conductive portion 725 can be provided inside the hole 73. This makes it possible to reduce the size of the distal end portion of the insertion tube 2.

According to the present embodiment, the conductive portion 725 is provided in the cutout portion 724 formed in the side surface, so that it is possible to reduce a height of a protrusion formed between the conductive portion 725 and the side surface on which the cutout portion 724 is not formed. In a case where the side surface on which the cutout portion 724 is formed is the inner peripheral side surface 723 constituting the inner peripheral surface of the hole 73, by providing the conductive portion 725 in the cutout portion 724, it is possible to prevent the conductive portion 725 from protruding on the inner peripheral surface of the hole 73 and to increase the diameter of the hole 73.

According to the present embodiment, the mounting substrate 72 is constituted with the multilayer substrate in which the plurality of substrates 720 are built up, so that it is possible to improve a degree of freedom in wiring of a wiring pattern that connects the conductive portion 725 and the light emitting element 71. In the mounting substrate 72 constituted with a multilayer substrate, the heat radiator 9 such as a heat sink is in close contact with the second surface 722 located on the opposite side of the first surface 721 which is the mounting surface of the light emitting element 71. Among the plurality of substrates 720 constituting the multilayer substrate, the substrate 720 other than the substrate 720 with which the heat radiator 9 is in close contact is provided with the cutout portion 724, but the substrate 720 with which the heat radiator 9 is in close contact, that is, the substrate 720 having the second surface 722 is not provided with the cutout portion 724. Thus, the conductive portion 725 is not provided on the substrate 720 (the substrate 720 including the second surface 722) with which the heat radiator 9 is in close contact. By not providing the cutout portion 724 and the conductive portion 725 in the substrate 720 in close contact with the heat radiator 9 among the plurality of substrates 720 constituting the multilayer substrate as described above, the heat radiator 9 can be insulated from the conductive portion 725 provided in the cutout portion 724 of the other substrate 720 by the substrate 720 in close contact with the heat radiator 9.

According to the present embodiment, the power supply line 8 extending from the processor device 10 side is connected in parallel to the conductive portion 725 in the extending direction of the insertion tube 2, so that it is possible to prevent the power supply line 8 from being bent at a portion of the power supply line 8 in the vicinity of the portion to which the conductive portion 725 is to be connected. This makes it possible to prevent generation of stress that peels off the power supply line 8 from conductive portion 725 and to improve connection strength (reliability of a soldered surface) between the power supply line 8 and the conductive portion 725. The power supply line 8 is prevented from being bent by providing the core wire 81 of the power supply line 8 on the inner peripheral side surface 723, so that interference with the image sensor 6 to be inserted into the central part of the hole 73 by a curved portion (R portion) due to the bending (bending) is eliminated. As a result, an inter-surface distance (clearance) between the inner peripheral side surface 723 of the mounting substrate 72 and the outer peripheral surface of the image sensor 6 only needs to be equal to an outer diameter dimension of the power supply line 8, so that it is possible to reduce an inner diameter dimension of the hole 73 of the mounting substrate 72 (inner diameter dimension of the mounting substrate 72).

Second Embodiment

Figure 6:
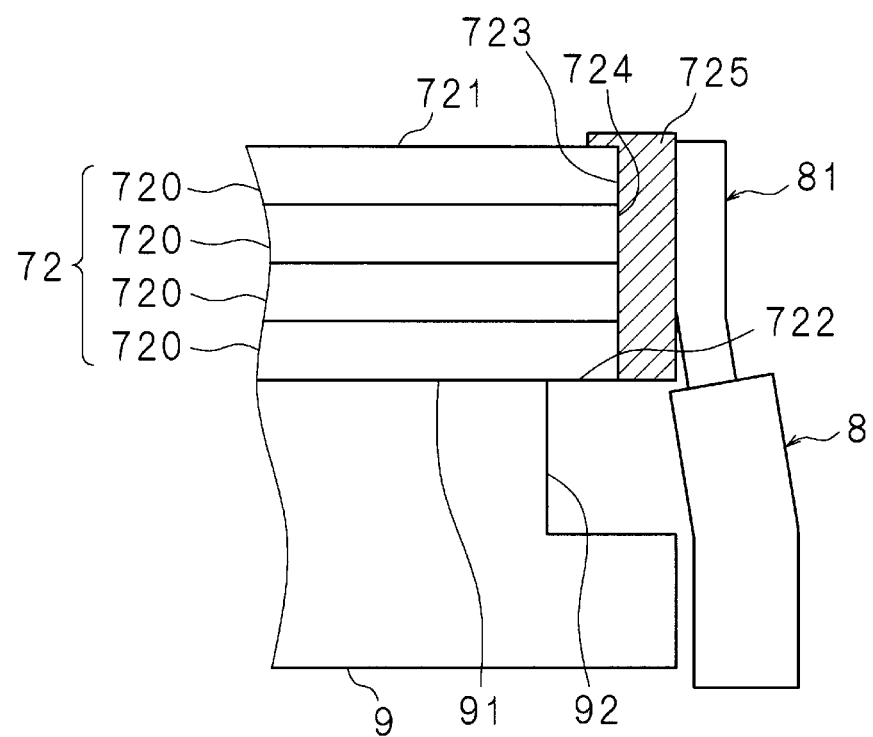
FIG. 6 is a schematic sectional side view illustrating an example of a mounting substrate according to a second embodiment (a recess in a heat radiator).

FIG. 6 is a schematic sectional side view illustrating an example of the mounting substrate 72 according to a second embodiment (a recess 92 in the heat radiator 9). In the present embodiment, the cutout portions 724 are formed on the side surfaces of all the substrates 720 constituting the mounting substrate 72 which is a multilayer substrate, and the cutout portions 724 of the substrates 720 are provided so as to be continuous in the thickness direction of the substrate 720. As a result, a groove-shaped cutout portion 724 extending in the thickness direction is formed on the inner peripheral side surface 723 of the multilayer substrate. In other words, the substrate 720 with which the heat radiator 9 is in close contact, that is, the substrate 720 having the second surface 722 is also provided with the cutout portion 724.

By forming the cutout portions 724 in all the substrates 720 constituting the mounting substrate 72 which is a multilayer substrate, the cutout portions 724 (groove) having the same length as a thickness of the mounting substrate 72 can be formed on the side surface of the mounting substrate 72, so that it is possible to increase a length of the cutout portion 724 parallel to the extending direction of the insertion tube 2. The conductive portion 725 is provided in the entire region of the cutout portion 724, so that it is possible to increase a length of the conductive portion 725 parallel to the extending direction of the insertion tube 2, increase a joint area for joining the conductive portion 725 and the core wire 81 of the power supply line 8 and improve joint strength between the conductive portion 725 and the core wire 81 (power supply line 8).

The close contact surface 91 of the heat radiator 9 that is in close contact with the second surface of the mounting substrate 72 while facing the second surface 722 is provided with the recess 92 formed by missing (cutting out) part of an edge portion. The recess 92 is formed in the close contact surface 91 along an edge portion (inner peripheral edge) of the inner periphery of the hole of the annular heat radiator 9.

The recesses 92 are provided corresponding to the conductive portions 725, and the number of the recesses 92 formed on the close contact surface 91 may be the same as the number of the conductive portions 725 provided on the inner peripheral side surface 723 of the mounting substrate 72. A positional correspondence relationship between the recess 92 and the conductive portion 725 includes a relationship in which a region of the recess 92 overlaps a region of the conductive portion 725 in a plan view of the mounting substrate 72, that is, in a direction perpendicular to the first surface 721 of the mounting substrate 72.

The recess 92 provided in the close contact surface 91 can reliably separate the conductive portion 725 of the mounting substrate 72, in particular, a portion of the conductive portion 725 provided on the substrate 720 (the substrate 720 located on the most rear end side) having the second surface 722 from the heat radiator 9, so that an insulation distance can be secured between the conductive portion 725 and the heat radiator 9.

Although the plurality of recesses 92 for securing the insulation distance between the conductive portion 725 and the heat radiator 9 are formed on the inner peripheral edge of the close contact surface 91 corresponding to the individual conductive portions 725, the present invention is not limited thereto. The recess 92 may be formed by missing (cutting out) the entire circumference at the inner peripheral edge of the hole provided in the close contact surface 91 of the heat radiator 9.

According to the present embodiment, in the mounting substrate 72, the heat radiator 9 such as a heat sink is in close contact with the second surface 722 located on the opposite side of the first surface 721 which is the mounting surface of the light emitting element 71, and the recess 92 is provided on the close contact surface 91 of the heat radiator 9 in close contact with the second surface 722, that is, the surface (close contact surface 91) of the heat radiator 9 facing the second surface 722. The recess 92 provided in the close contact surface 91 can separate the conductive portion 725 of the mounting substrate 72 from the heat radiator 9, so that insulation of the heat radiator 9 from the conductive portion 725 can be ensured.

It should be noted that the embodiments disclosed herein are illustrative in all respects and are not restrictive. The technical features described in the embodiments can be combined with each other, and the scope of the present invention is intended to include all modifications and equivalents within the scope of the claims.

REFERENCE SIGNS LIST 1 endoscope
10 processor device
2 insertion tube
20 soft portion
21 bending section
22 distal end portion
23 connection portion
24 housing
25 objective lens
26 light distribution lens
3 operation unit
30 bending operation knob
31 operation button
4 universal tube
5 connector unit
6 image sensor
7 light emitting module
71 light emitting element
711 light emitting element land
72 mounting substrate
720 substrate
721 first surface
722 second surface
723 inner peripheral side surface
724 cutout portion
725 conductive portion (positive electrode side conductive portion, negative electrode side conductive portion)
726 outer peripheral side surface
73 hole
8 power supply line
81 core wire
9 heat radiator
91 close contact surface
92 recess

The invention claimed is:

1. An endoscope comprising:
a light emitting module incorporated in a distal end portion of an insertion tube, the light emitting module including a mounting substrate on which a plurality of light emitting elements is mounted, the mounting substrate having an annular shape in which a hole through which an image sensor using the light emitting elements as a light source is to be inserted is provided in a central portion, the mounting substrate including:
a first surface on which the light emitting elements are surface-mounted,
a second surface located on an opposite side of the first surface, and
a side surface located at a peripheral edge of the first surface, the side surface including a cutout portion formed therein;
a heat radiator in close contact with the second surface of the mounting substrate;
a recess provided on a close contact surface of the heat radiator and recessed relative to the cutout portion, the close contact surface being in close contact with the second surface of the mounting substrate;
a conductive portion electrically connected to the light emitting elements and provided in the cutout portion, wherein the conductive portion is separated from the heat radiator by the recess; and
a power supply line for supplying power to the light emitting elements and connected to the conductive portion.

2. The endoscope according to claim 1,
wherein the side surface is an inner peripheral side surface constituting an inner peripheral surface of the hole.

3. The endoscope according to claim 1,
wherein the mounting substrate is a multilayer substrate in which a plurality of substrates is built up,
a heat radiator is in close contact with a second surface located on an opposite side of the first surface, and
the cutout portion is formed in a substrate other than a substrate with which the heat radiator is in close contact among the plurality of substrates constituting the multilayer substrate.

4. The endoscope according to claim 1,
wherein the power supply line extends from a processor device side to be connected to the endoscope, and
is connected in parallel to the conductive portion in an extending direction of the insertion tube.

5. The endoscope according to claim 1,
wherein the conductive portion includes positive electrode side conductive portions to be connected to a positive electrode side of the light emitting elements and negative electrode side conductive portions to be connected to a negative electrode side of the light emitting elements, and
a number of the negative electrode side conductive portions to be connected to the negative electrode side is smaller than a number of the positive electrode side conductive portions to be connected to the positive electrode side.

* * * * *